(12) United States Patent
Lai et al.

(10) Patent No.: US 10,325,888 B2
(45) Date of Patent: Jun. 18, 2019

(54) MANUFACTURING METHOD OF DISPLAY

(71) Applicant: PlayNitride Inc., Tainan (TW)

(72) Inventors: Yu-Hung Lai, Tainan (TW); Tzu-Yang Lin, Tainan (TW); Yu-Yun Lo, Tainan (TW)

(73) Assignee: PlayNitride Inc., Tainan (TW)

( * ) Notice: Subject to any disclaimer, the term of this patent is extended or adjusted under 35 U.S.C. 154(b) by 0 days.

(21) Appl. No.: 15/828,380

(22) Filed: Nov. 30, 2017

(65) Prior Publication Data

US 2018/0158806 A1 Jun. 7, 2018

(30) Foreign Application Priority Data

Dec. 2, 2016 (TW) .............................. 105140022 A

(51) Int. Cl.
*H01L 25/075* (2006.01)
*H01L 33/62* (2010.01)
*H01L 23/00* (2006.01)
*H01L 25/00* (2006.01)
*H01L 33/00* (2010.01)

(52) U.S. Cl.
CPC .......... *H01L 25/0753* (2013.01); *H01L 24/97* (2013.01); *H01L 25/50* (2013.01); *H01L 33/62* (2013.01); *H01L 33/0095* (2013.01); *H01L 2924/12041* (2013.01); *H01L 2933/0066* (2013.01)

(58) Field of Classification Search
None
See application file for complete search history.

(56) References Cited

U.S. PATENT DOCUMENTS

| 9,583,450 | B2* | 2/2017 | Li | H01L 24/97 |
|---|---|---|---|---|
| 2013/0026511 | A1* | 1/2013 | Yeh | H01L 25/0753 257/89 |
| 2015/0024551 | A1* | 1/2015 | Yukimori | H01L 24/75 438/113 |
| 2015/0111329 | A1* | 4/2015 | Wu | H01L 33/0095 438/28 |

(Continued)

FOREIGN PATENT DOCUMENTS

| TW | 201612991 | 4/2016 |
|---|---|---|
| TW | 201631703 | 9/2016 |
| TW | 201640602 | 11/2016 |

*Primary Examiner* — Andres Munoz
(74) *Attorney, Agent, or Firm* — JCIPRNET

(57) ABSTRACT

A manufacturing method of a display including the following steps is provided. Firstly, a back plate, a first transfer platform and a second transfer platform are provided, wherein a plurality of first light-emitting devices are disposed on the first transfer platform, and a plurality of second light-emitting devices are disposed on the second transfer platform. Secondly, a plurality of first bonding layers are formed at a plurality of first positions of the back plate. Then, the first transfer platform and the back plate are correspondingly docked, so that the first light-emitting devices are bonded on the first positions through the first bonding layers. After that, a plurality of second bonding layers are formed at a plurality of second positions of the back plate. Finally, the second transfer platform and the back plate are correspondingly docked, so that the second light-emitting devices are bonded on the second positions through the second bonding layers.

12 Claims, 17 Drawing Sheets

(56) References Cited

U.S. PATENT DOCUMENTS

| | | | |
|---|---|---|---|
| 2016/0219702 A1* | 7/2016 | Chaji | H01L 24/29 |
| 2016/0240516 A1* | 8/2016 | Chang | H01L 25/0753 |
| 2016/0336304 A1* | 11/2016 | Wu | H01L 21/6835 |
| 2018/0096977 A1* | 4/2018 | Ahmed | H01L 25/13 |
| 2018/0102350 A1* | 4/2018 | Kim | H01L 25/50 |
| 2018/0166429 A1* | 6/2018 | Chong | H01L 21/78 |
| 2018/0261582 A1* | 9/2018 | Henry | H01L 27/1214 |
| 2018/0350783 A1* | 12/2018 | Yoo | H05K 999/99 |

* cited by examiner

MANUFACTURING METHOD OF DISPLAY

CROSS-REFERENCE TO RELATED APPLICATION

This application claims the priority benefit of Taiwan application serial no. 105140022, filed on Dec. 2, 2016. The entirety of the above-mentioned patent application is hereby incorporated by reference herein and made a part of this specification.

BACKGROUND OF THE INVENTION

1. Field of the Invention

The invention relates to a manufacturing method of a display, and particularly relates to a manufacturing method of a light emitting diode display.

2. Description of Related Art

As the opto-electronic technologies advance, the size of various opto-electronic devices has become miniaturized. Owing to the breakthrough in size in the manufacturing of light emitting diodes (LEDs) in recent years, the light emitting diode (LED) displays manufactured by arranging the LEDs into an array have drawn the attention on the market. The LED displays are a type of displays of active light emitting devices. In addition to lower power consumption compared to the organic light emitting diode (OLED) displays, the LED displays also provide a better display performance of a higher contrast ratio, and thus have a higher view ability in the sunlight. Furthermore, since the LED displays are made from an inorganic material, the LED displays have the characteristics of a higher reliability and longer lifetime compared to the OLED displays.

In the LED displays, LEDs are arranged into an array on a circuit back plate to form a plurality of pixels for projecting or displaying images. In the manufacturing process of a micro LED color display, LED chips with different emission colors need to be picked individually and aligned precisely to predetermined positions on the circuit back plate to form a plurality of sub-pixels of a pixel. However, the conventional display usually has millions of pixels, and the size of the LED device is very small, it is difficult to be pick and align the LED devices precisely. Thus, the conventional process is high cost, long manufacturing time, and low yield.

SUMMARY OF THE INVENTION

The invention provides a manufacturing method of the display capable of quickly and accurately arranging light emitting devices with different emission colors on a back plate of a display, making the manufacturing cost of the display lower and the yield rate of the display higher.

A manufacturing method of a display according to an embodiment of the invention includes: providing a back plate; providing a first transfer platform, wherein a plurality of first light emitting devices are disposed on the first transfer platform; forming a plurality of first bonding layers at a plurality of first positions of the back plate; docking the first transfer platform and the back plate after forming the first bonding layers to transfer the first light emitting devices to the first positions by the first bonding layers. The number of the first light emitting devices bonded to the back plate is equal to the number of the first bonding layers; providing a second transfer platform, wherein a plurality of second light emitting devices are disposed on the second transfer platform; forming a plurality of second bonding layers at a plurality of second positions of the back plate; and docking the second transfer platform and the back plate after forming the second bonding layers to transfer the second light emitting devices to the second positions by the second bonding layers. The number of the second light emitting devices bonded to the back plate is equal to the number of the second bonding layers.

According to an embodiment of the invention, in the manufacturing method of the display, when the second transfer platform is docked to the back plate, the projection regions of the second light emitting devices disposed on the second transfer platform on the back plate do not overlap with the first positions, and the first positions and the second positions correspond to a plurality of sub-pixel regions of the display.

According to an embodiment of the invention, in the manufacturing method of the display, the first transfer platform is at a first docking position of the back plate in the step of docking the first transfer platform and the back plate, the second transfer platform is at a second docking position of the back plate in the step of docking the second transfer platform and the back plate, there is a shifting distance between the first docking position and the second docking position.

According to an embodiment of the invention, the manufacturing method of the display further includes: providing a third transfer platform, wherein a plurality of third light emitting devices are disposed on the third transfer platform; forming a plurality of third bonding layers at a plurality of third positions of the back plate; and docking the third transfer platform and the back plate, such that the third light emitting devices corresponding to the third positions are bonded to the third positions by the third bonding layers.

According to an embodiment of the invention, in the manufacturing method of the display, when the third transfer platform is docked to the back plate, projections of the third light emitting devices of the third transfer platform on the back plate do not overlap with positions of the first light emitting devices and the second light emitting devices on the back plate.

According to an embodiment of the invention, the manufacturing method of the display further includes: forming a plurality of fourth bonding layers at a plurality of fourth positions of the back plate; docking the third transfer platform and the back plate, such that the third light emitting devices corresponding to the fourth positions are bonded to the fourth positions by the fourth bonding layers; forming a plurality of fifth bonding layers at a plurality of fifth positions of the back plate; docking the first transfer platform and the back plate, such that the first light emitting devices corresponding to the fifth positions are bonded to the fifth positions by the fifth bonding layers; forming a plurality of sixth bonding layers at a plurality of sixth positions of the back plate; docking the second transfer platform and the back plate, such that the second light emitting devices corresponding to the sixth positions are bonded to the sixth positions by the sixth bonding layers; forming a plurality of seventh bonding layers at a plurality of seventh positions of the back plate; docking the second transfer platform and the back plate, such that the second light emitting devices corresponding to the seventh positions are bonded to the seventh positions by the seventh bonding layers; forming a plurality of eighth bonding layers at a plurality of eighth positions of the back plate; docking the third transfer platform and the back plate, such that the third light emitting devices corresponding to the eighth positions are bonded to the eighth positions by the eighth bonding layers; forming a plurality of ninth bonding layers at a plurality of ninth positions of the back plate; and docking the first transfer platform and the back plate, such that the first light emitting devices corresponding to the ninth positions are bonded to the ninth positions by the ninth bonding layers.

According to an embodiment of the invention, in the manufacturing method of the display, the first light emitting devices, the second light emitting devices, and the third light emitting devices respectively emit light in different emission colors, and are arranged into strip arrangement on the back plate.

According to an embodiment of the invention, in the manufacturing method of the display, the first light emitting devices, the second light emitting devices, and the third light emitting devices respectively emit light in different emission colors, and are arranged into mosaic arrangement on the back plate.

According to an embodiment of the invention, the first positions, the second positions, and the third positions are in matrix arrangement and located in a region of the back plate.

According to an embodiment of the invention, one of the first light emitting devices, one of the second light emitting devices, and one of the third light emitting devices adjacent on the back plate form a display pixel of the display.

According to an embodiment of the invention, providing the first transfer platform further includes: forming an adhesion layer between the first light emitting devices and the first transfer platform, such that the first light emitting devices are fixed on the first transfer platform through an adhesion force provided by the adhesion layer.

According to an embodiment of the invention, when the first transfer platform and the back plate are docked, the first bonding layers provides a bonding force to the first light emitting devices. The bonding force is greater than the adhesion force.

According to an embodiment of the invention, the manufacturing method of the display further includes: after docking the first transfer platform and the back plate to bond the first light emitting devices to the back plate by the first bonding layers, separating the first transfer platform and the back plate, wherein a residual material of the adhesion layer remains on at least a part of the first light emitting devices.

According to an embodiment of the invention, the manufacturing method of the display further includes: removing the residual material of the adhesion layer on the first light emitting devices.

According to an embodiment of the invention, a diagonal length of each of the first light emitting devices and the second light emitting devices is in a range from 2 micrometers to 150 micrometers.

Based on the above, in the manufacturing method of the display according to the embodiments of the invention, the transfer platforms and the back plate are docked to bond the respective parts of the light emitting devices in several times. In addition, when the transfer platform is docked to the back plate, the positions of the light emitting devices on the transfer platforms not bonded to the back plate do not correspond to the positions of the light emitting devices already bonded to the back plate. Therefore, the light emitting devices on the transfer platforms which are about to bond to the back plate do not contact the light emitting devices already bonded to the back plate. The probability of collision during the docking step can be greatly reduced. In addition, since the light emitting devices with different emission colors on the display are transferred to the back plate by docking the transfer platforms to the back plate in several times, and in each time of the docking step, a predetermined number of light emitting devices are bonded to the back plate, Therefore, the manufacturing method of the display according to the embodiments of the invention is able to quickly and accurately arrange the light emitting devices with different emission colors on the back plate of the display, making the manufacturing cost of the display lower and the yield rate of the display higher.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
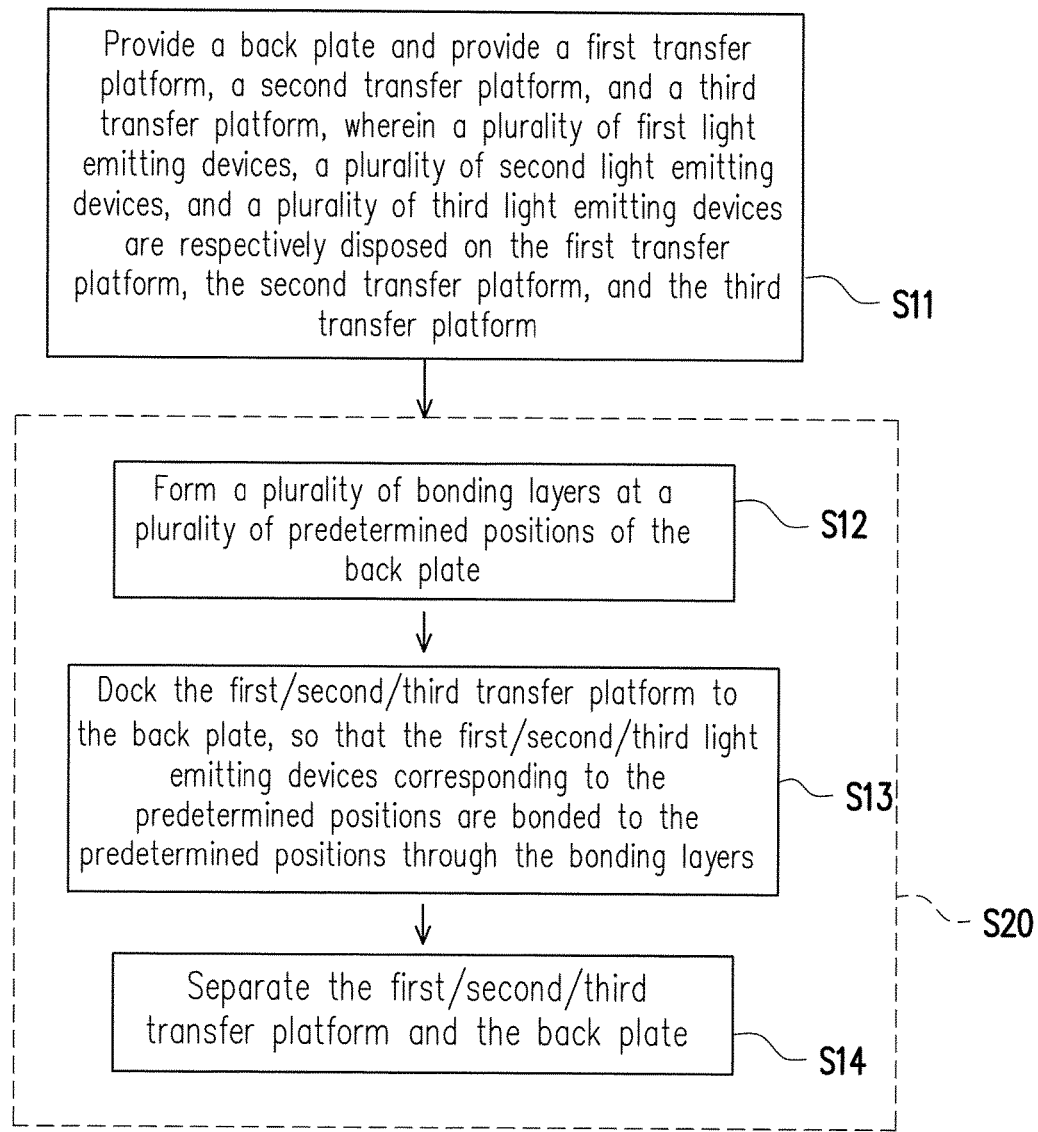
FIG. 1 is a flowchart illustrating main processes of a manufacturing method of a display according to a first embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Figure 2:
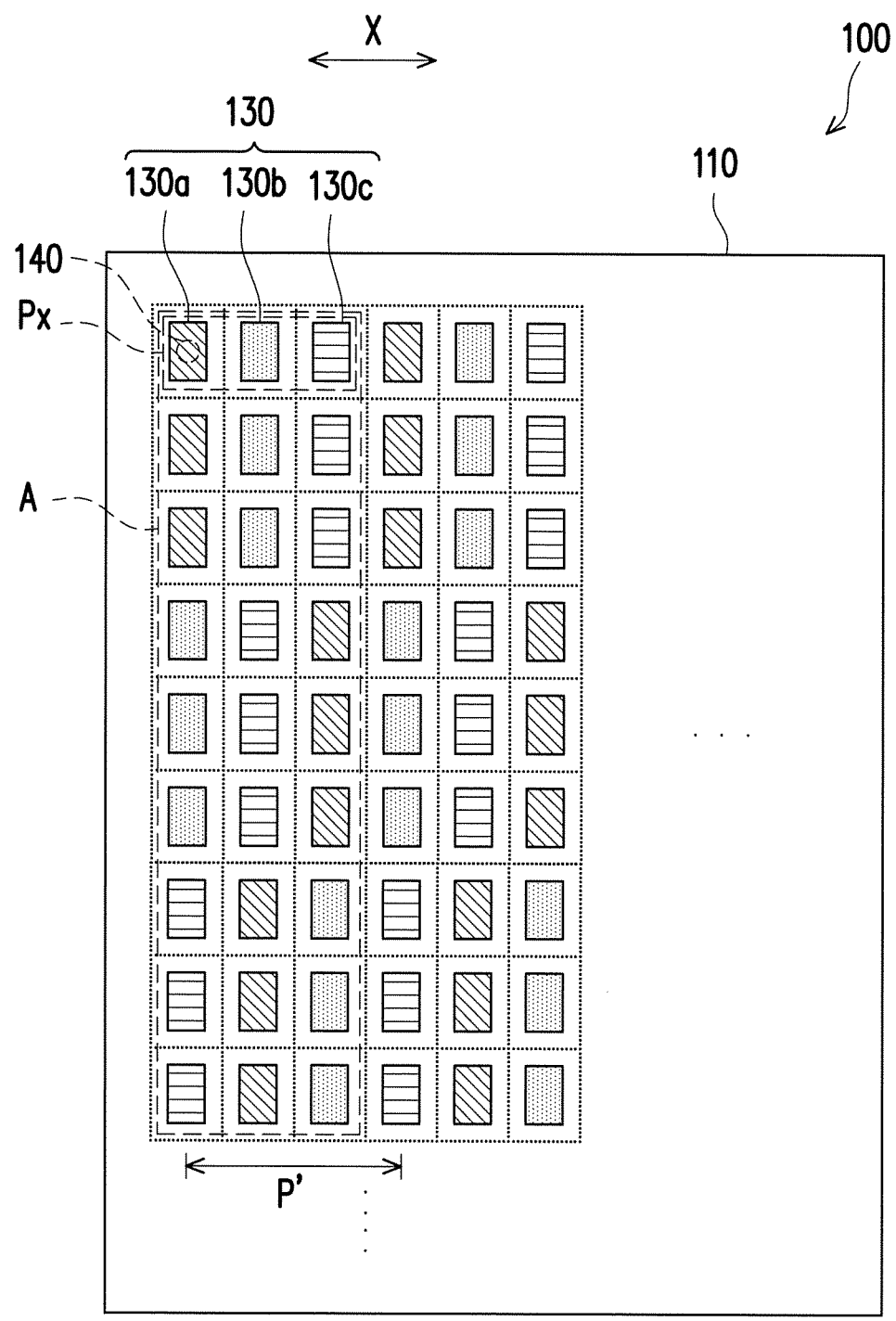
FIG. 2 is a schematic top view illustrating a display manufactured according to the first embodiment of the invention.
Figure 3:
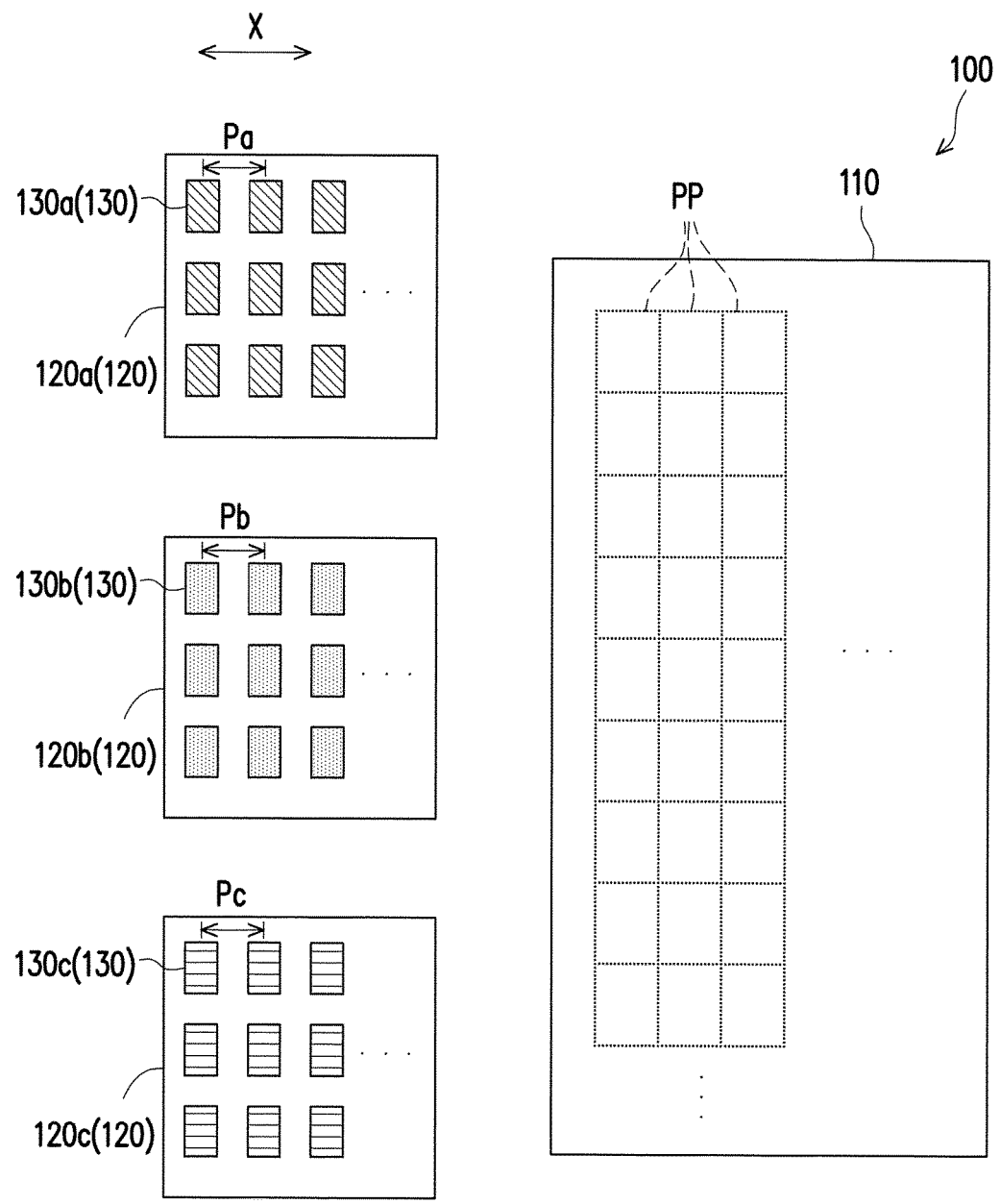
FIG. 3 is a view illustrating a back plate and transfer platforms provided in the manufacturing method of the display according to the first embodiment of the invention.

FIG. 1 is a flowchart illustrating main processes of a manufacturing method of a display according to a first embodiment of the invention, and FIG. 2 is a schematic top view illustrating a display 100 manufactured according to the first embodiment. In addition, FIG. 3 is a view illustrating a back plate 110 and transfer platforms 120 provided in the manufacturing method of the display according to the first embodiment of the invention. Referring to FIGS. 1 to 3, the manufacturing method of the display are described in detail in the following.

Firstly, referring to FIGS. 1 and 3, at Step S11, the back plate 110 and the transfer platforms 120 are provided. In the first embodiment, the back plate 110 has a plurality of predetermined positions PP arranged to an ordered array, and each of the predetermined positions PP is, for example, a corresponding position of a sub-pixel of the display. The transfer platforms 120 include a first transfer platform 120*a*, a second transfer platform 120*b*, and a third transfer platform 120*c*. In addition, a plurality of light emitting devices 130 are disposed on the transfer platforms 120. Specifically, a plurality of first light emitting devices 130a arranged in an array are disposed on the first transfer platform 120a, a plurality of second light emitting devices 130b arranged in an array are disposed on the second transfer platform 120b, and a plurality of third light emitting devices 130c arranged in an array are disposed on the third transfer platform 120c. However, in other embodiments, based on practical design needs, the light emitting devices 130 may include a plurality of fourth light emitting devices or other light emitting devices, and the transfer platforms 120 may include a fourth transfer platform or other numbers of transfer platforms. The invention does not intend to impose a limitation on the types and numbers of the transfer platforms. A pitch of the light emitting devices 130 in the X direction is different from a pitch of the predetermined positions PP having the same emission color in the X direction. To be more specific, the pitch Pa of the first light emitting devices 130a on the transfer platform 120a is smaller than the pitch P' of the predetermined positions PP of the back plate 110 (FIG. 2 and FIG. 3). The pitch Pb of the second light emitting devices 130b is smaller than the pitch P' of the predetermined positions PP. The pitch Pc of the third light emitting devices 130c is smaller than the pitch P' of the predetermined positions PP.

In the first embodiment, the first light emitting devices 130a, the second light emitting devices 130b, and the third light emitting devices 130c are, for example, respectively blue light emitting diodes (LEDs), green LEDs, and red LEDs. Specifically, the light emitting devices 130 (i.e., the first light emitting devices 130a, the second light emitting devices 130b, and the third light emitting devices 130c) are, for example, miniaturized micro LEDs. In addition, a diagonal length of each of the light emitting devices 130 is in a range from 2 micrometers to 150 micrometers, for example. The micro LEDs emitting light in different emission colors may be bonded to the back plate 110 to form display pixels in the micro LED display, so as to display an image.

Figure 4A:
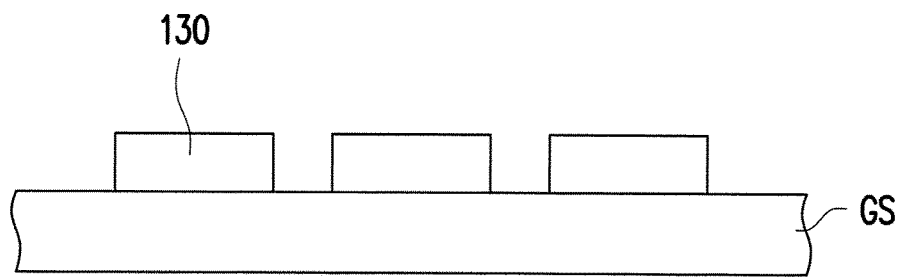
FIGS. 4A and 4C are views illustrating forming light emitting devices and arranging the light emitting devices on the transfer platform.
Figure 4B:
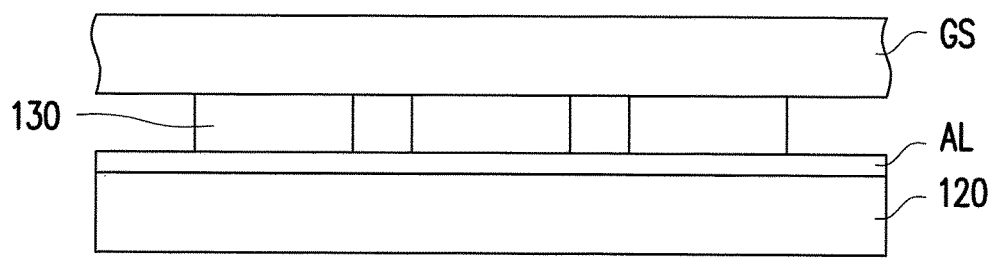
Figure 4C:
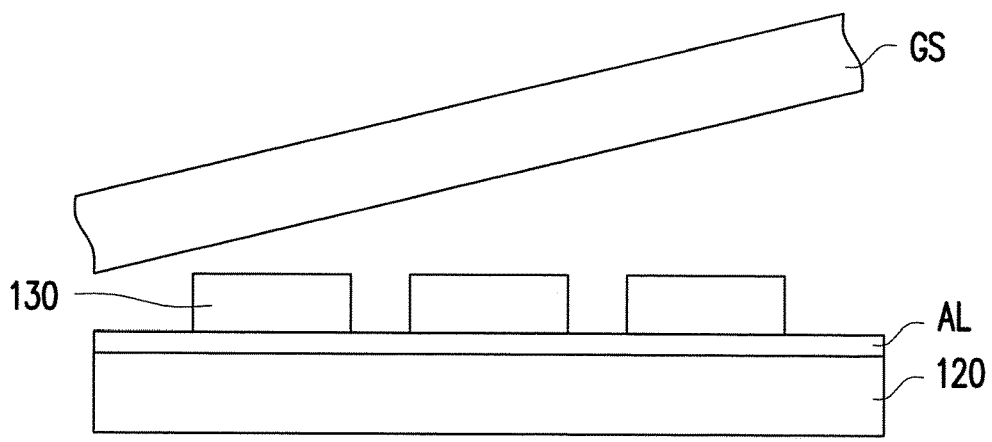

More specifically, a process of arranging and disposing the light emitting devices 130 on the respective transfer platforms 120 are illustrated in FIGS. 4A to 4C. Providing the transfer platforms 120 in Step S11 of the first embodiment further includes the following. Referring to FIG. 4A, a substrate GS is provided. The substrate GS is a growth substrate, for example. Then, the light emitting devices 130 are formed on the substrate GS. Specifically, the light emitting devices 130 may be formed by an epitaxial process, for example. However, the invention is not limited thereto. Then, referring to FIG. 4B, an adhesion layer AL is formed between the light emitting devices 130 and the transfer platforms 120. Accordingly, the light emitting devices 130 are transferred from the substrate GS to the transfer platforms 120 by the adhesion layer AL. Specifically, the adhesion layer AL may be formed on the transfer platforms 120 by coating. In addition, the substrate GS and the light emitting devices 130 formed on the substrate GS face toward the transfer platforms 120 and the light emitting devices 130 are adhered to the transfer platforms 120 through adhesion of the adhesion layer AL. Then, referring to FIG. 4C, the substrate GS and the light emitting devices 130 are separated. Accordingly, the light emitting devices 130 are arranged and disposed on the transfer platforms 120. In the embodiment, a process of separating the substrate GS and the light emitting devices 130 includes performing a laser lift-off process to separate the substrate GS and the light emitting devices 130. However, in some embodiments, the substrate GS may be removed by performing a chemical etching process. The invention does not intend to impose a limitation in this regard.

Figure 5A:
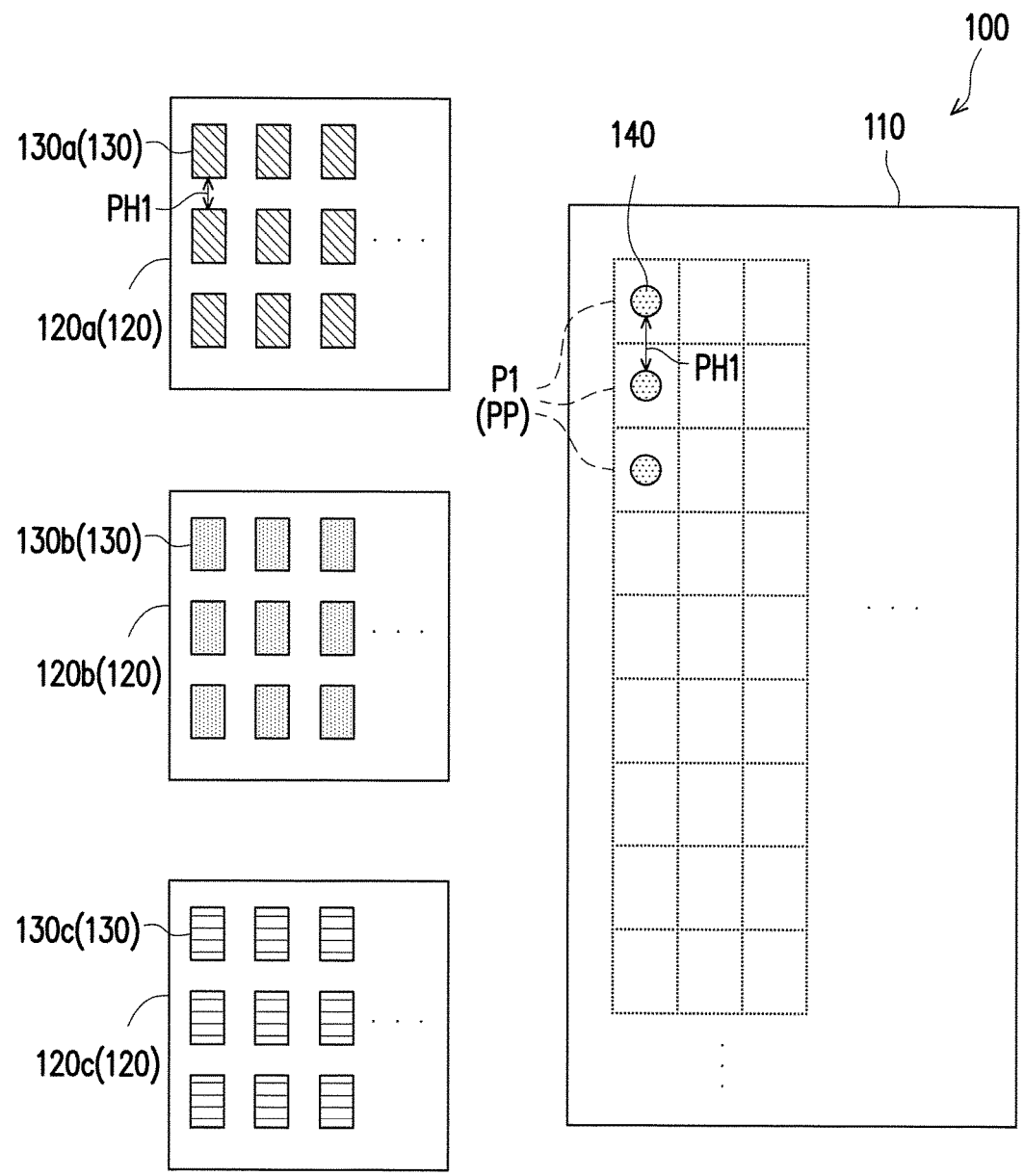
FIGS. 5A to 5E are views illustrating the manufacturing method of the display according to the first embodiment of the invention.

FIGS. 5A to 5E are views illustrating the manufacturing method of the display according to the first embodiment of the invention. Referring to FIGS. 1 and 5A, the manufacturing process of the display according to the first embodiment further includes performing a repetitive Step 20 after Step S11. The repetitive Step S20 includes Sub-step S12, Sub-step S13, and Sub-step S14 that are sequentially executed. At Sub-step S12, a plurality of first bonding layers 140 are formed at a plurality of first positions P1 of the back plate 110. In addition, the first positions P1 are a part of the predetermined positions PP.

Figure 5B:
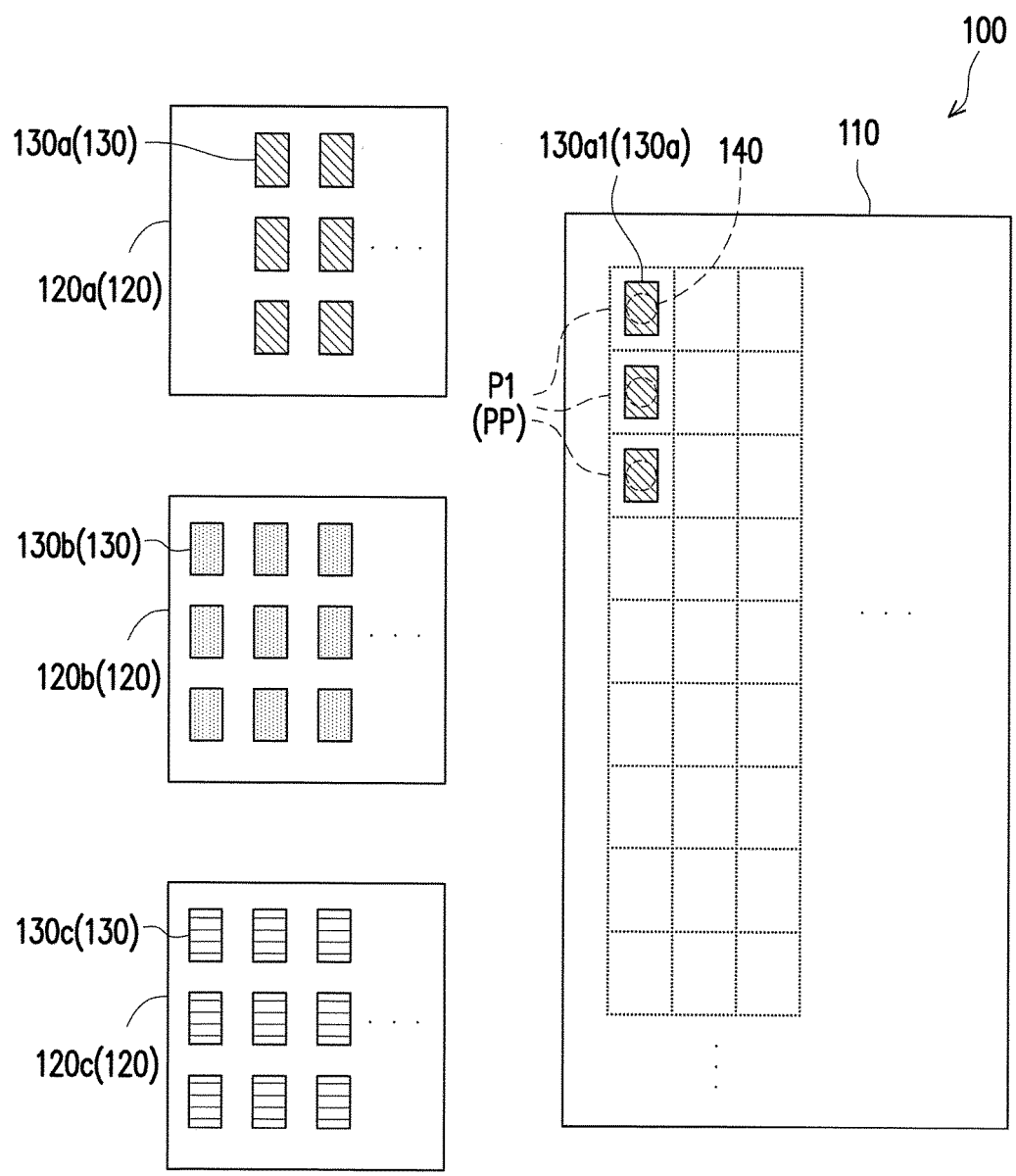

Then, referring to FIGS. 1 and 5B, after Sub-step S12, Sub-step S13 is executed to dock the first transfer platform 120a to the back plate 110 after forming the first bonding layer 140, so as to bond a plurality first light emitting devices 130a1 (a part of the light emitting devices 130a) on the first transfer platform 120a to the first positions P1 through the first bonding layers 140. The number of the first light emitting devices 130a1 bonded to is equal to the number of the first bonding layers 140. Other first light emitting devices 130a not corresponding to the first bonding layers 140 are still disposed on the first transfer platform 120a instead of being transferred to the back plate 110. More specifically, when the first transfer platform 120a and the back plate 110 are docked, the first bonding layers 140 provide a bonding force to the corresponding first light emitting devices 130a1. Besides, the bonding force is greater than the adhesion force provided by the adhesion layer AL. Therefore, the first light emitting devices 130a1 are bonded to the first positions P1 through the bonding layer 140a.

After Sub-step S13, Sub-step S14 is executed. At Sub-Step S14, the first transfer platform 120a and the back plate 110 are separated. Since the bonding force provided by the first bonding layers 140 is greater than the adhesion force provided by the adhesion layer AL to the first light emitting devices 130a1, the first light emitting devices 130a1 are transferred to the first positions P1 of the back plate 110. Other first light emitting devices 130a not corresponding to the first bonding layers 140 are still disposed on the first transfer platform 120a through the adhesion layer AL. It should be noted that, when separating the first transfer platform 120a and the back plate 110, the adhesion layer AL may be remained on the first light emitting devices 130a1 bonded to the back plate 110. Therefore, a process of the first embodiment after Sub-step S14 further includes removing the residual materials of the adhesion layer AL on the first light emitting devices 130a1. However, in another process, the residual materials of the adhesion layer AL remaining on the light emitting devices 130 may be removed after all of the light emitting devices 130 are transferred to the back plate 110 (i.e., after multiple times of the repetitive Step S20 are completed, as explicated in the subsequent descriptions). During transferring of the light emitting devices 130 to the back plate 110, the adhesion layer AL remaining on the light emitting devices 130 may protect the light emitting devices 130 bonded to the back plate 110 (i.e. 130a1), so as to avoid damages to or displacements of the light emitting devices 130 caused by interferences of external force or other factors during the subsequent bonding and transferring processes.

Figure 5C:
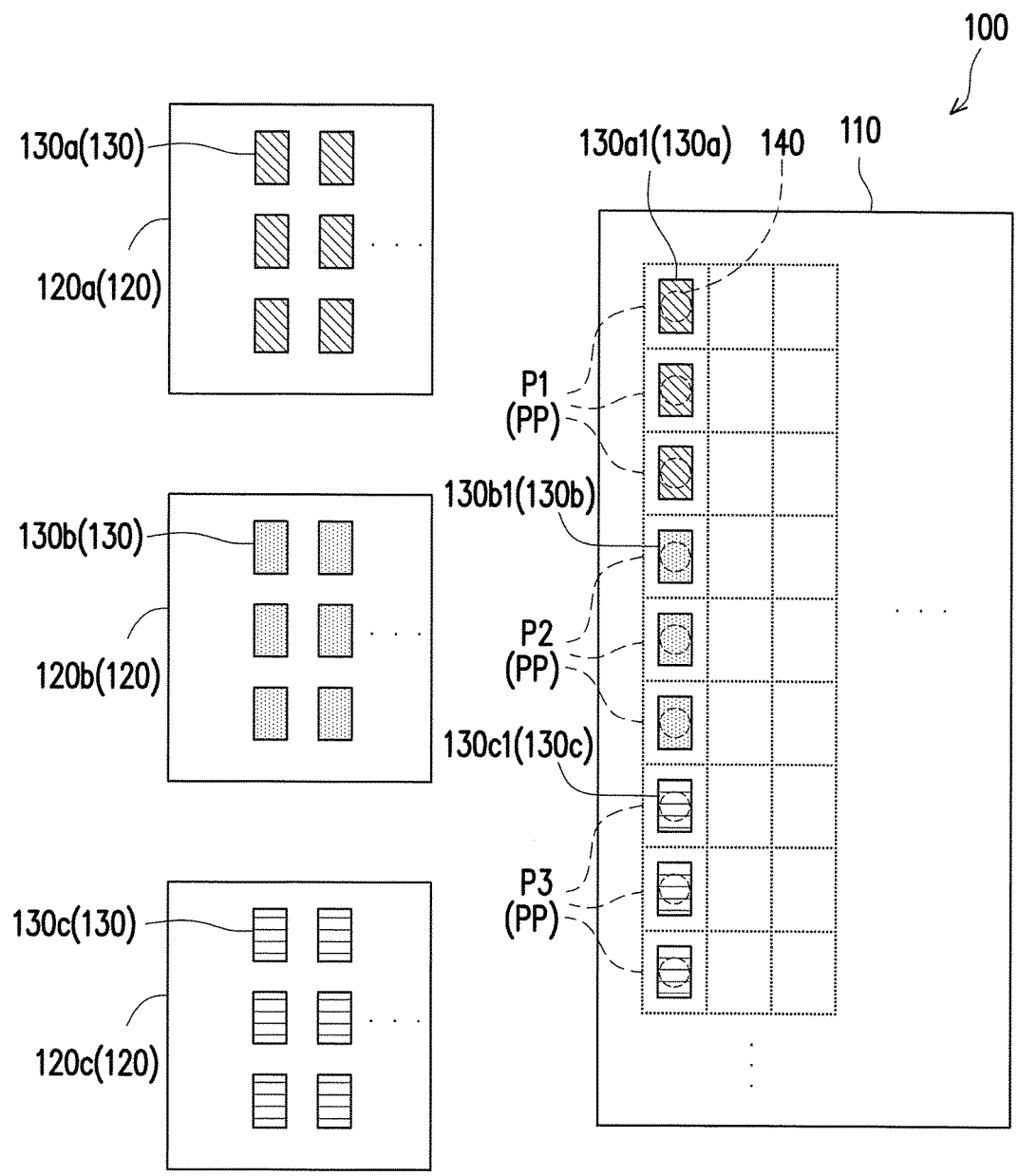

Referring to FIGS. 1 and 5C, after the first transfer platform 120a and the back plate 110 are separated, the repetitive Step S20 is executed again. First of all, Sub-step S12 is executed to form a plurality of second bonding layers (not shown) at a plurality of second positions P2 of the back plate 110. Then, Sub-step S13 is executed to dock the second transfer platform 120b and the back plate 110 after forming the second bonding layers, so as to bond a plurality of second light emitting devices 130b1 (a part of the second light emitting devices 130b) to the second positions P2 by the second bonding layers. The number of the second light emitting devices 130b1 bonded to the back plate 110 is equal to the number of the second bonding layers. Specifically, when the second transfer platform 120b and the back plate 110 are docked, projections regions of the second light emitting devices 130b disposed on the second transfer platform 120b on the back plate 110 are not overlapped with positions of the first light emitting devices 130a1 bonded to the back plate 110. In other words, when the second transfer platform 120b and the back plate 110 are docked, the first light emitting devices 130a1 and the second light emitting devices 130b are not on the same positions of the back plate 110. Then Sub-step S14 is executed to separate the second transfer platform 120b and the back plate 110, so as to transfer a part of second light emitting devices 130b (i.e., the second light emitting devices 130b1) on the second transfer platform 120b to the back plate 110. In addition, other second light emitting devices 130b not corresponding to the second bonding layers remain on the second transfer platform 120b.

Then, the repetitive Step S20 is executed. First of all, at Sub-step S12, a plurality of third bonding layers (not shown) are formed at a plurality of third positions P3 on the back plate 110. Then, at Sub-step S13, the third transfer platform 120c and the back plate 110 are docked, so as to bond third light emitting devices 130c1 (a part of the third light emitting devices 130c) to the third positions P3 of the back plate 110 through the third bonding layers. Then, Sub-step S14 is executed to separate the third transfer platform 120c and the back plate 110. Specifically, when the third transfer platform 120c and the back plate 110 are docked, projections of the third light emitting devices 130c of the third transfer platform 120c on the back plate 110 are not overlapped with the positions of the first light emitting devices 130a1 and the second light emitting devices 130b1 bonded to the back plate 110.

Thus far, the light emitting devices in the first columns of the respective transfer platforms are already transferred to the back plate. In other words, with the sizes of the transfer platforms and the back plate, a certain number of the light emitting devices are transferred together in each time of docking step according to the method of the embodiment of the invention. In the first embodiment, firstly, the light emitting devices (i.e., first light emitting devices 130a1) in a column on the transfer platform (i.e., first transfer platform 120a) are transferred to the first docking positions (i.e., first positions P1) in the first time of the docking step. Then, another transfer platform (i.e., second transfer platform 120b) is shifted downward in parallel relative to the first transfer platform 120a to the second docking positions (i.e., second positions P2), the light emitting devices (i.e., second light emitting devices 130b1) in another column on the another transfer platform are transferred to the second docking positions (i.e., second positions P2) in the second time of the docking step. However, in other embodiments, it is also possible to transfer the light emitting devices of a complete row on the transfer platform to the back plate 110 in first time of the docking step. Next, the another transfer platform may be shifted laterally in parallel relative to the transfer platform, and then transfer the light emitting devices of a complete row on the another transfer platform to the back plate 110 in the second time of the docking step. The invention does not intend to impose a limitation in this regard.

Figure 5D:
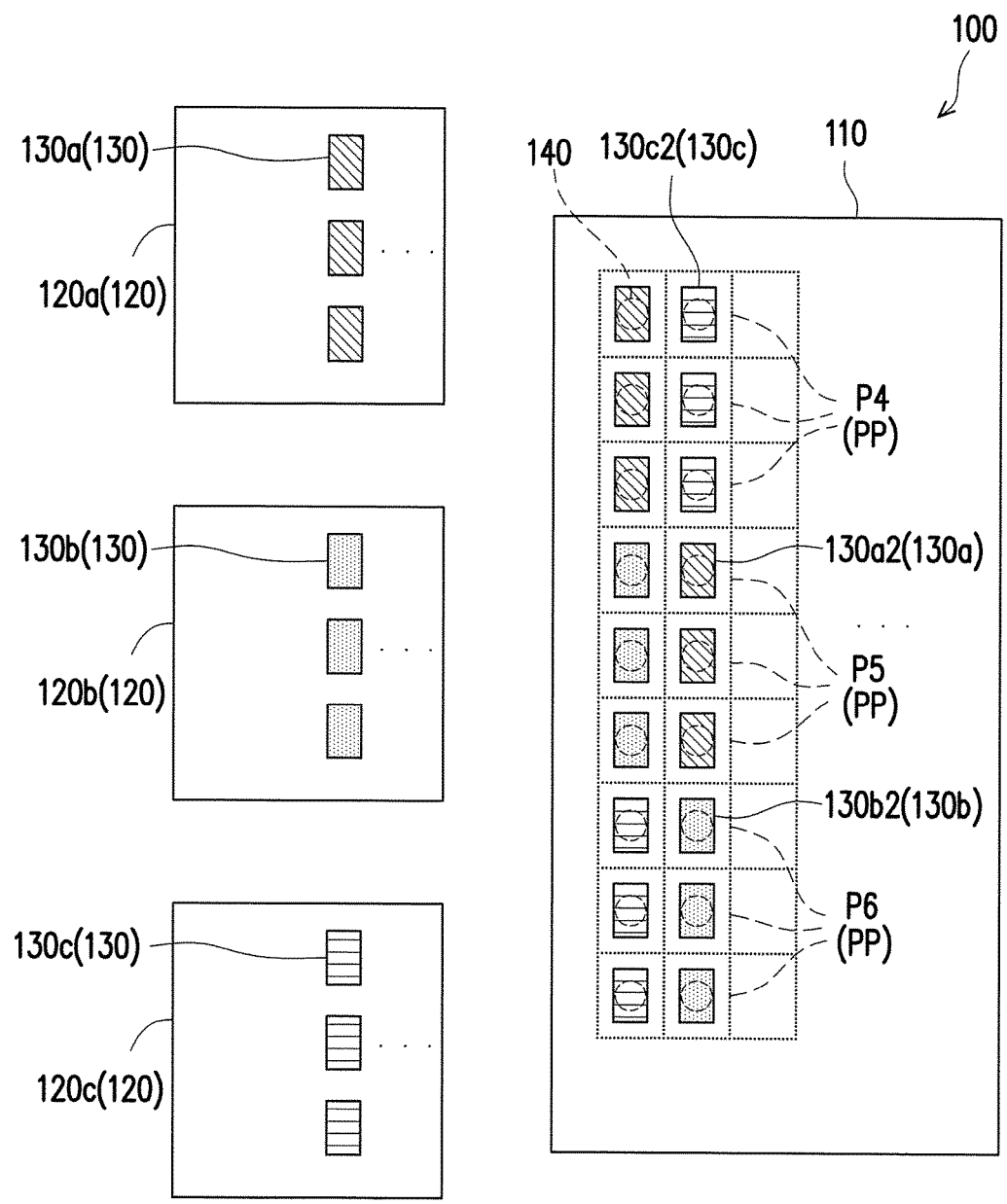

Referring to FIGS. 1 and 5D at the same time, the repetitive Step S20 is executed. A plurality of fourth bonding layers (not shown) are formed at a plurality of fourth positions P4 of the back plate 110. Then, the third transfer platform 120c and the back plate 110 are docked to bond a plurality of third light emitting devices 130c2 (a part of the third light emitting devices 130c of the third transfer platform 120c) to the fourth positions P4 of the back plate 110 through the fourth bonding layers. Then, the third transfer platform 120c and the back plate 110 are separated.

Then, the repetitive Step S20 is executed again. A plurality of fifth bonding layers (not shown) are formed at a plurality of fifth positions P5 of the back plate 110. Then, the first transfer platform 120a and the back plate 110 are docked to bond a plurality of first light emitting devices 130a2 (a part of the first light emitting devices 130a of the first transfer platform 120a) to the fifth positions P5 through the fifth bonding layers. Then, the first transfer platform 120a and the back plate 110 are separated.

Then, the repetitive Step S20 is executed again. A plurality of sixth bonding layers (not shown) are formed at a plurality of sixth positions P6 of the back plate 110. Then, the second transfer platform 120b and the back plate 110 are docked to bond a plurality of second light emitting devices 130b2 (a part of the second light emitting devices 130b of the second transfer platform 120b) to the sixth positions P6 through the sixth bonding layers. Then, the second transfer platform 120b and the back plate 110 are separated.

Figure 5E:
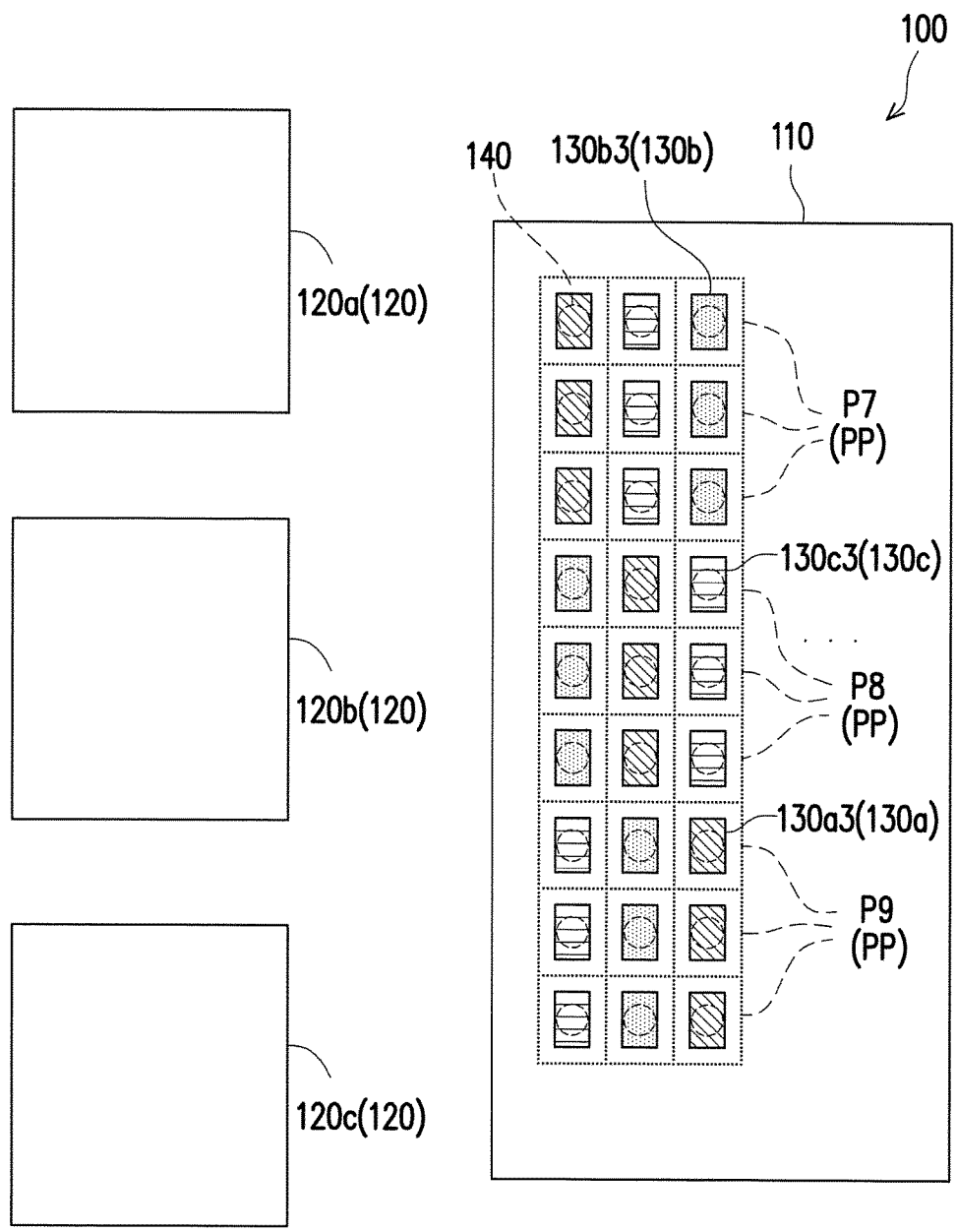

Referring to FIGS. 1 and 5E at the same time, the repetitive Step S20 is executed. A plurality of seventh bonding layers (not shown) are formed at a plurality of seventh positions P7 of the back plate 110. Then, the second transfer platform 120b and the back plate 110 are docked to bond a plurality of second light emitting devices 130b3 (a part of the second light emitting devices 130b of the second transfer platform 120b) to the seventh positions P7 through the seventh bonding layers. Then, the second transfer platform 120b and the back plate 110 are separated.

Then, the repetitive Step S20 is executed again. A plurality of eighth bonding layers (not shown) are formed at a plurality of eighth positions P8 of the back plate 110. Then, the third transfer platform 120c and the back plate 110 are docked to bond a plurality of third light emitting devices 130c3 (a part of the third light emitting devices 130c of the third transfer platform 120c) to the eighth positions P8 through the eighth bonding layers. Then, the third transfer platform 120c and the back plate 110 are separated.

Then, the repetitive Step S20 is executed again. A plurality of ninth bonding layers (not shown) are formed at a plurality of ninth positions P9 of the back plate 110. Then, the first transfer platform 120a and the back plate 110 are docked to bond a plurality of first light emitting devices 130a3 (a part of the first light emitting devices 130a of the first transfer platform 120a) to the ninth positions P9 through the ninth bonding layers.

Specifically, the repetitive Step S20 is executed to transfer the light emitting devices 130 on the transfer platforms 120 to the back plate 110, so as to dispose the light emitting device 130 at each sub-pixel position on the back plate 110, as shown in FIG. 2. Specifically, the light emitting devices 130 emitting light in different emission colors may form the display pixels of the micro LED display. For example, one of the first light emitting devices 130a, one of the second light emitting devices 130b, and one of the third light emitting devices 130c adjacent to each other on the back plate 110 of the display 100 form a display pixel Px of the display 100. A plurality of the display pixels Px are arranged and disposed on the back plate 110. In addition, the display pixels Px display a colored display image. In addition, the light emitting devices 130 with different emission colors may also project a colored projection frame. In relevant embodiments, the light emitting devices 130 with different emission colors may bring forth a full-color display or a full-color projection effect by suitable arrangement of light emitting devices 130. The invention does not intend to impose a limitation on the choices on colors and the arrangements of the light emitting devices 130. For example, the first light emitting devices 130a, the second light emitting devices 130b, and the third light emitting devices 130c are in a mosaic arrangement on the back plate 110. In other words, the emission colors of the light emitting devices 130 in the same column or row of the micro LED display 100 are different. Regarding the display pixel Px, two or more arrangements are available for the arrangement of the colors of the sub-pixels of the display pixel Px. In relevant embodiments, the choice on emission colors of the light emitting devices 130 and the arrangement of the light emitting devices 130 on the back plate 110 may be adjusted based on different needs of use, design specifications, and strategies for product placement.

In the first embodiment, a surface of the back plate 110 includes an electric circuit (not shown), and the light emitting devices 130 are electrically connected to the electric circuit through a plurality of contact pads of the electric circuit. Therefore, the light emitting devices 130 arranged in an array on the back plate 110 are driven by the electric circuit. In other words, the back plate 110 may be a semiconductor substrate, a submount, a complementary metal-oxide-semiconductor (CMOS) circuit substrate, a liquid crystal on silicon (LCOS) substrate, a thin film transistor (TFT) substrate, or substrates of other types. The type of the back plate 110 and the corresponding electric circuit of the back plate 110 may be adjusted subject to different needs of use, design specifications, and strategies for product placement. The invention does not intend to impose a limitation in this regard.

In addition, in order to illustrate the process of transferring the light emitting devices 130 from the transfer platforms 120 to the back plate 110 in the manufacturing method of the display in greater detail, in FIGS. 2, 3, and 5A to 5E, only respectively nine first light emitting devices 130a, nine second light emitting devices 130b, and nine third light emitting devices 130c on the transfer platforms 120 are shown for an illustrative purpose. However, in practice, a different number, such as a number far greater than nine, of the light emitting devices 130 may be arranged and disposed on the respective transfer platforms 120. The invention does not intend to impose a limitation on the number of the light emitting devices 130 arranged and disposed on the respective transfer platforms 120.

In addition, referring to both FIGS. 2 and 3, In the first embodiment, the back plate 110 has a plurality of regions A. Corresponding to the regions A, the first transfer platform 120a, the second transfer platform 120b, and the third transfer platform 120c transfer the light emitting devices 130 into the regions A. In addition, the first positions P1, the second positions P2, the third positions P3, the fourth positions P4, the fifth positions P5, the sixth positions P6, the seventh positions P7, the eighth positions P8, and the ninth positions P9 form a matrix arrangement and are located in the regions A of the back plate 110. In the first embodiment, a color arrangement of each of the respective regions A may be considered as a repetitive unit of pixel arrangement. In addition, a plurality of the repetitive units formed by the regions A may be arranged as an array on the back plate 110. Specifically, in other embodiments, the repetitive units may also have other numbers of light emitting devices with different emission color and other arrangements of light emitting devices with different emission colors. The invention is not limited thereto.

In the first embodiment, with the processes, the light emitting devices 130 as required may be massively transferred to the back plate 110 in several times, and in each time of docking step, a predetermined number of the light emitting devices 130 are transferred to the back plate 110, so as to complete manufacturing of the micro LED display 110. Specifically, by the choice on the transfer platforms 120 and the bonding layers on the predetermined positions PP, a predetermined number of the light emitting devices 130 are transferred to the back plate 110 of the display 100 in one time, and the number of times of alignment during the transfer of the light emitting devices may also be reduced. The light emitting devices 130 may be disposed on the back plate 110 without the needs of being individually picked and aligned. Therefore, with the manufacturing method of the display 100, the light emitting devices 130 with different emission colors are able to be arranged on the back plate 110 of the micro LED display 100 quickly and accurately. Therefore, the manufacturing cost of the micro LED display 100 is reduced, and the yield rate of the micro LED display 100 is facilitated.

FIGS. 6A to 6D are views illustrating a manufacturing method of a display 600 according to a second embodiment of the invention. First of all, a back plate 610 and a plurality of transfer platforms 620 are provided. A plurality of light emitting devices 630 are disposed on the transfer platforms 620. Specifically, the transfer platforms 620 include a first transfer platform 620a having a plurality of first light emitting devices 630a, a second transfer platform 620b having a plurality of second light emitting devices 630b, and a third transfer platform 630c having a plurality of third light emitting devices 630c. What differs from the first embodiment is that pitches between the light emitting devices 630 on the transfer platforms 620 are not the same as pitches between the predetermined positions PP (i.e., the positions of the sub-pixels) on the back plate 610.

Figure 6A:
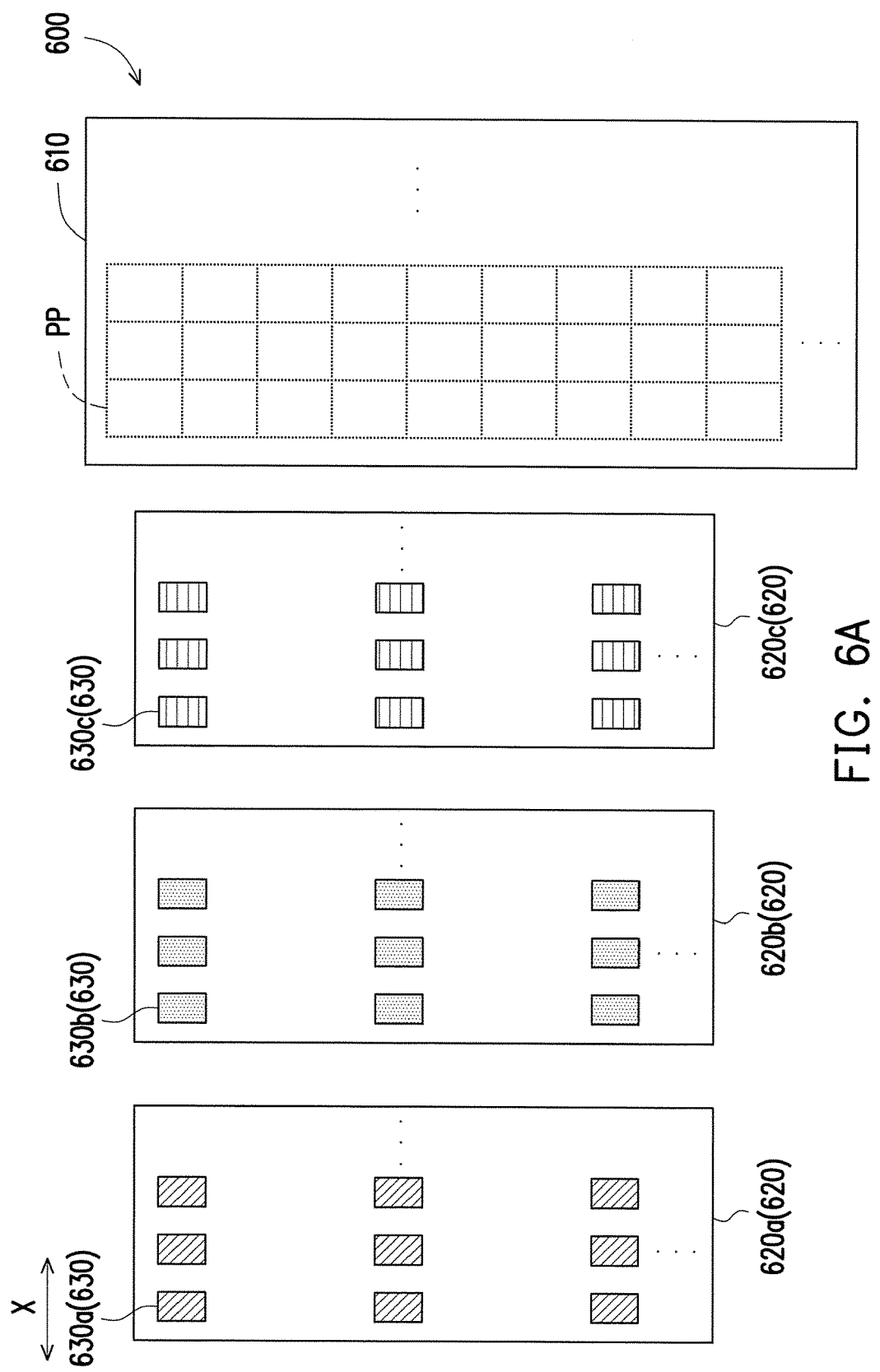
FIGS. 6A to 6D are views illustrating a manufacturing method of a display according to a second embodiment of the invention.
Figure 6B:
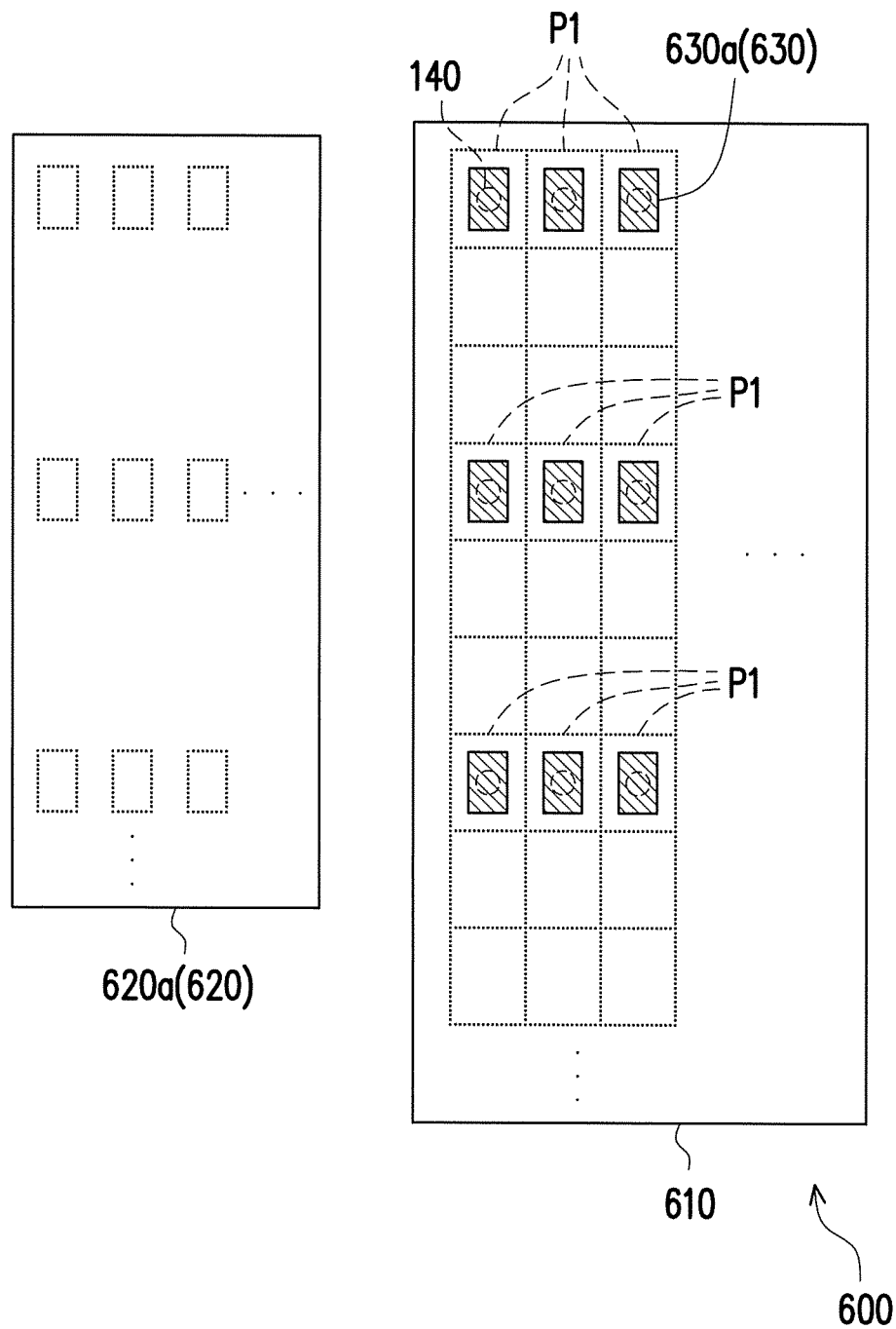

Referring to FIGS. 6A and 6B, in the second embodiment, the repetitive Step S20 similar to the step S20 of the first embodiment is executed. First of all, the first bonding layers 140 are formed at the first positions P1 of the back plate 610. Then, the first transfer platform 620a is docked to the back plate 610 to bond first light emitting devices 630a corresponding to the first positions P1 to the back plate 610 through the first bonding layers 140. Then, the first transfer platform 620a and the back plate 610 are separated.

Figure 6C:
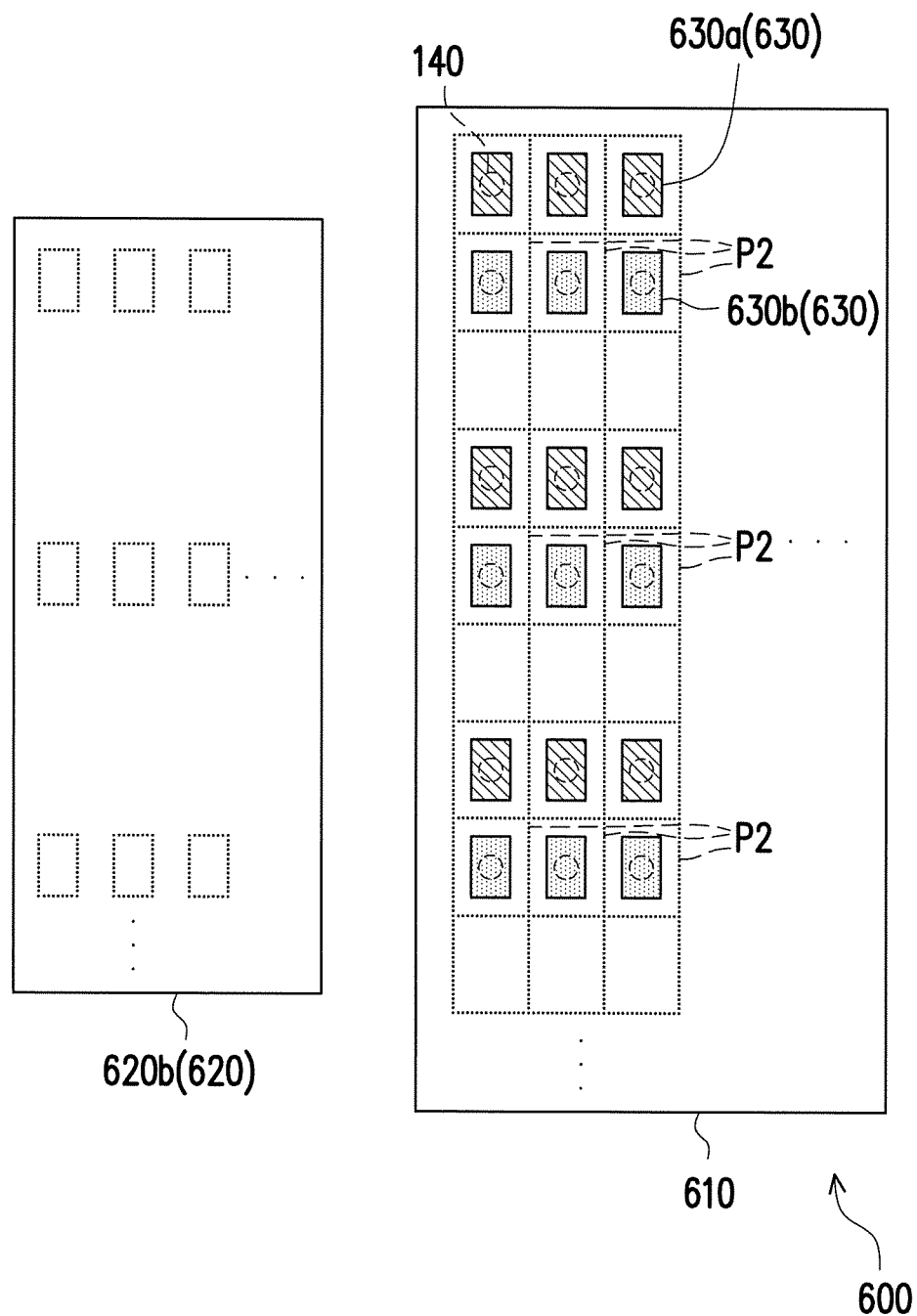

Then, referring to FIG. 6C, the repetitive Step S20 is executed to form the second bonding layers (not shown) at the second positions P2 of the back plate 610. Then, the second transfer platform 620b is docked to the back plate 610 to bond second light emitting devices 630b to the back plate 610 through the second bonding layers. Then, the second transfer platform 620c and the back plate 610 are separated. It should be noted that, compared with the first docking positions (i.e. first positions P1) where the first transfer platform 620a and the back plate 610 are docked, the second docking positions (i.e. second positions P2) where the second transfer platform 620b and the back plate 610 are docked are determined by shifting the second transfer platform 620b downward one row of sub-pixels (i.e., the pitch Px of predetermined position PP) relative to the first transfer platform 620a. Accordingly, the second light emitting devices 630b on the second transfer platform 620b are not overlapped with positions of the first light emitting devices 630a disposed on the back plate 610, thereby preventing the light emitting devices 630 from being damaged due to collision during the transfer.

Figure 6D:
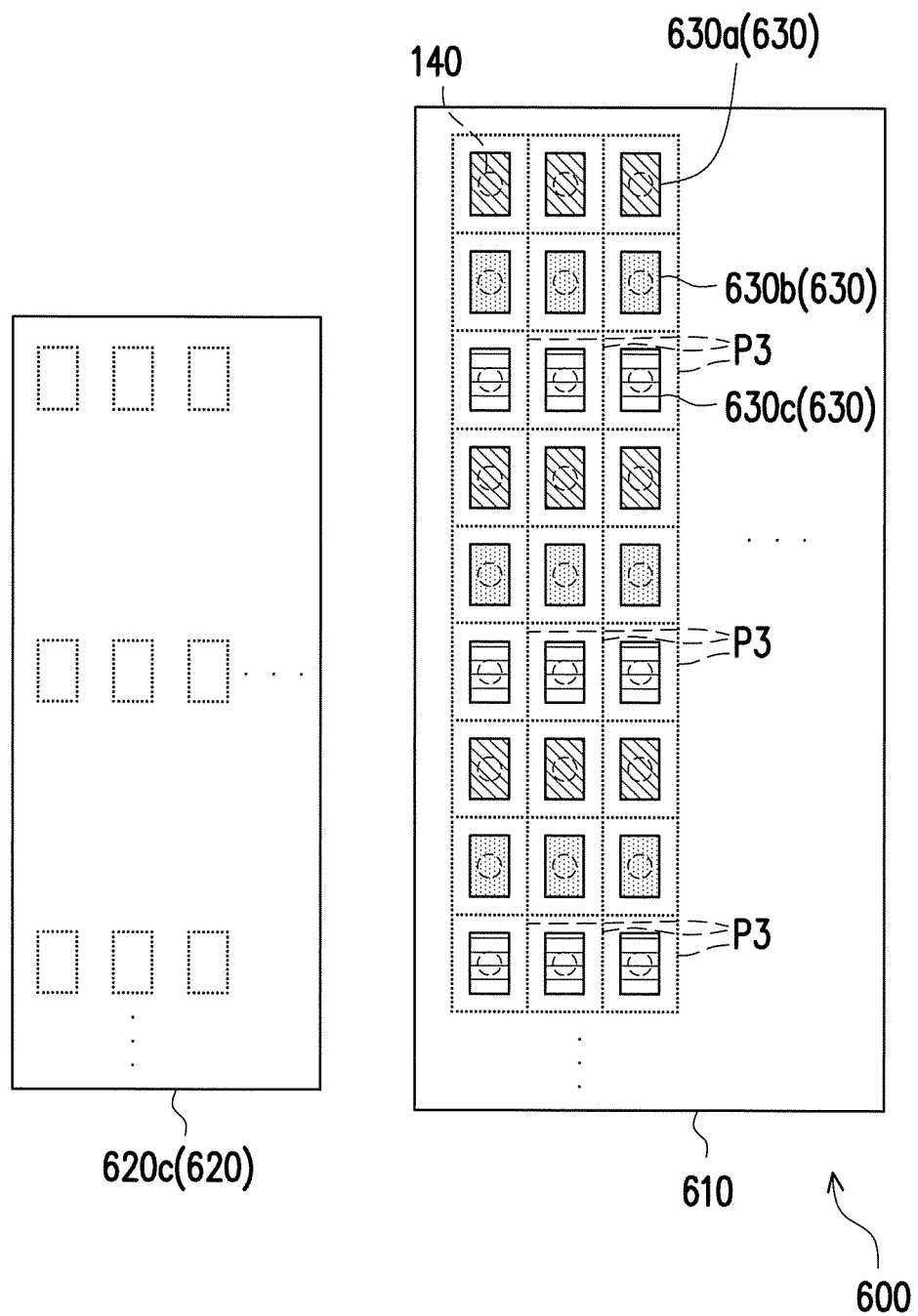

Referring to FIG. 6D, then, the third bonding layers (not shown) are formed at the third positions P3 on the back plate 610. Then, the third transfer platform 620c is docked to the back plate 610 to bond third light emitting devices 630c to the back plate 610 through the third bonding layers. Then, the third transfer platform 620c and the back plate 610 are separated. Specifically, relative to the position where the second transfer platform 620b is docked, a position where the third transfer platform 620c and the back plate 610 are docked is further shifted one sub-pixel downward (i.e., the distance of one predetermined position PP). In the second embodiment, the first light emitting devices 630a, the second light emitting devices 630b, and the third light emitting devices 630c transferred to the back plate 610 are in strip arrangements, for example, on the back plate 610. Namely, the color arrangements shown by the display pixels are in strip arrangements, for example. In other words, sub-pixels in the same row or column on the micro LED display 600 are in the same color.

Specifically, in the second embodiment, even though the light emitting devices 630 in an axial direction are sacrificed in each of the transfer platforms 620 in terms of the number of light emitting devices disposed as compared with the first embodiment, more of the light emitting devices 630 are transferred to the back plate 610 in each docking of the transfer platforms 620 and the back plate 610. Therefore, the number of times of docking the transfer platforms 620 and the back plate 610 is further reduced, making the overall manufacturing yield rate of the display 600 facilitated.

FIGS. 7A to 7D are views illustrating a manufacturing method of a display according to a third embodiment of the invention. First of all, referring to FIG. 7A, a plurality of back plates 710 are provided. The back plates 710 include a first back plate 710a, a second back plate 710b, and a third back plate 710c. Specifically, the manufacturing method a display of the third embodiment may form a plurality of displays, such as a display 700a, a display 700b, and a display 700c. In addition, the display 700a includes the first back plate 710a, the display 700b includes the second back plate 710b, and the display 700c includes the third back plate 710c. Specifically, the number of the back plates 710 (i.e., the number of the displays) corresponds to the number of colors of light emitted by light emitting devices 730 of each of the displays (i.e., the display 700a, the display 700b, and the display 700c). For example, in the third embodiment, each of the displays has the light emitting devices 730 emitting light in three colors. Thus, at least three back plates 710 are correspondingly provided. In addition, the back plates 710 have the predetermined positions PP defined by pixels.

In the third embodiment, a plurality of transfer platforms 720 are provided. The transfer platforms 720 include a first transfer platform 720a having a plurality of first light emitting devices 730a, a second transfer platform 720b having a plurality of second light emitting devices 730b, and a third transfer platform 720c having a plurality of third light emitting devices 730c.

Figure 7A:
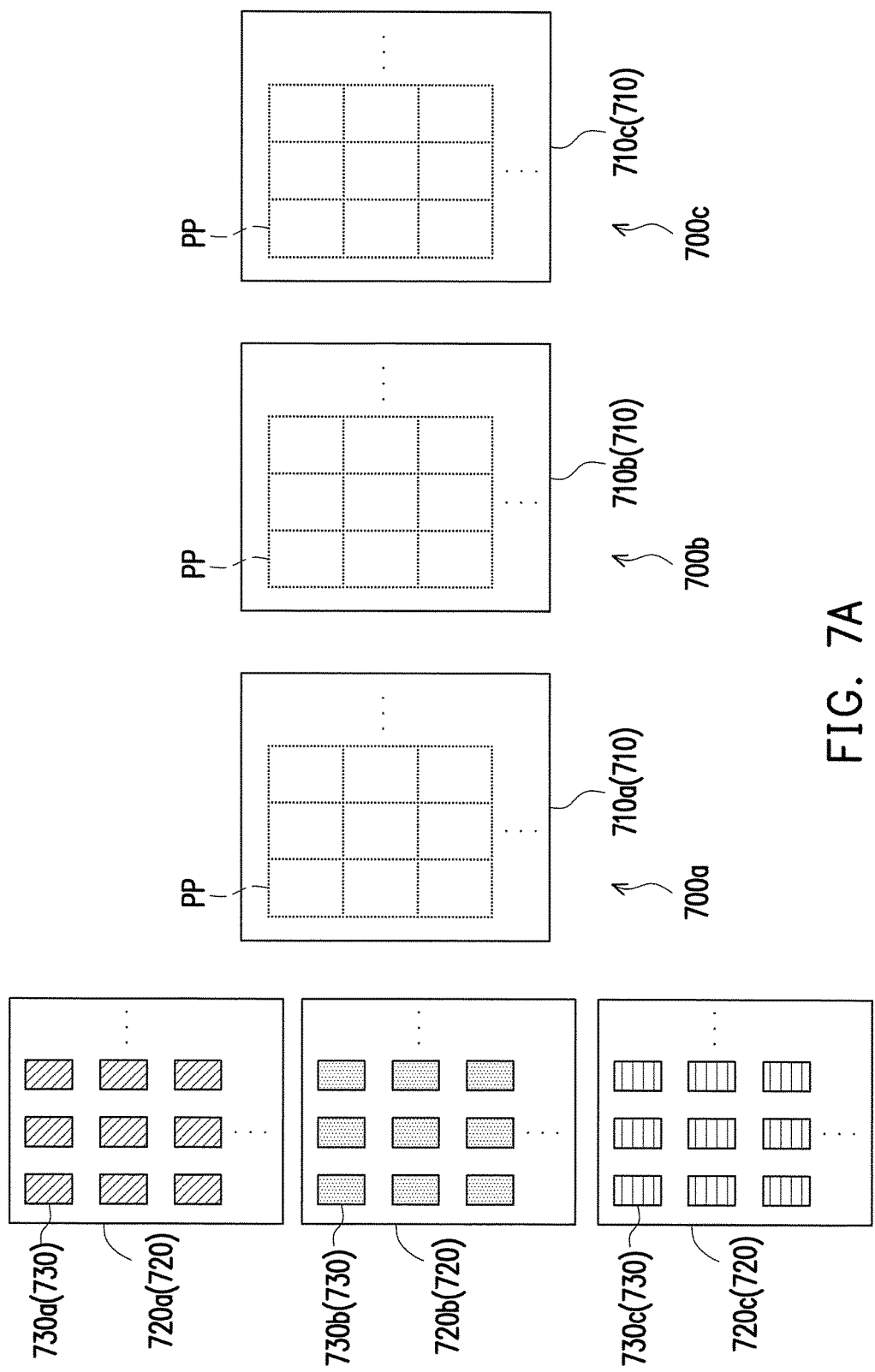
FIGS. 7A to 7D are views illustrating a manufacturing method of a display according to a third embodiment of the invention.
Figure 7B:
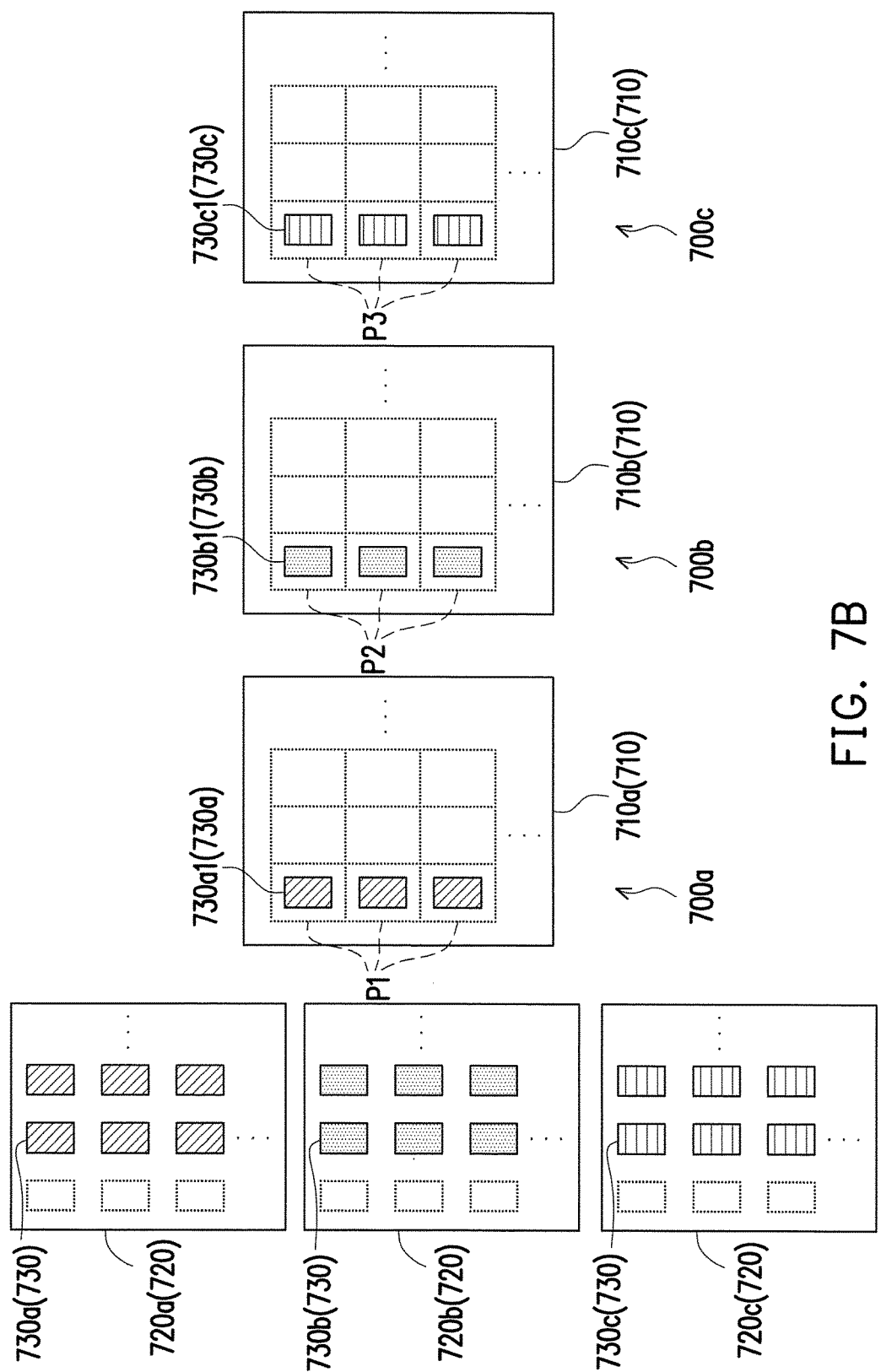

Referring to FIG. 7B, the first bonding layers (not shown) are formed at the first positions P1 of the first back plate 710a, the second bonding layers (not shown) are foil led at the second positions P2 of the second back plate 710b, and the third bonding layers (not shown) are formed at the third positions P3 of the third back plate 710c. Then, the first transfer platform 720a, the second transfer platform 720b, and the third transfer platform 720c are respectively docked to the first back plate 710a, the second back plate 710b, and the third back plate 710c, so as to bond a plurality of first light emitting devices 730a1 (a part of a plurality of first light emitting devices 730a) to the first positions P1 of the back plate 710a through the first bonding layers, bond a plurality of second light emitting devices 730b1 (a part of a plurality of second light emitting devices 730b) to the second positions P2 of the back plate 710b through the second bonding layers, and bond a plurality of third light emitting devices 730c1 (a part of a plurality of light emitting devices 730c) to the third positions P3 of the back plate 710c through the third bonding layers.

Figure 7C:
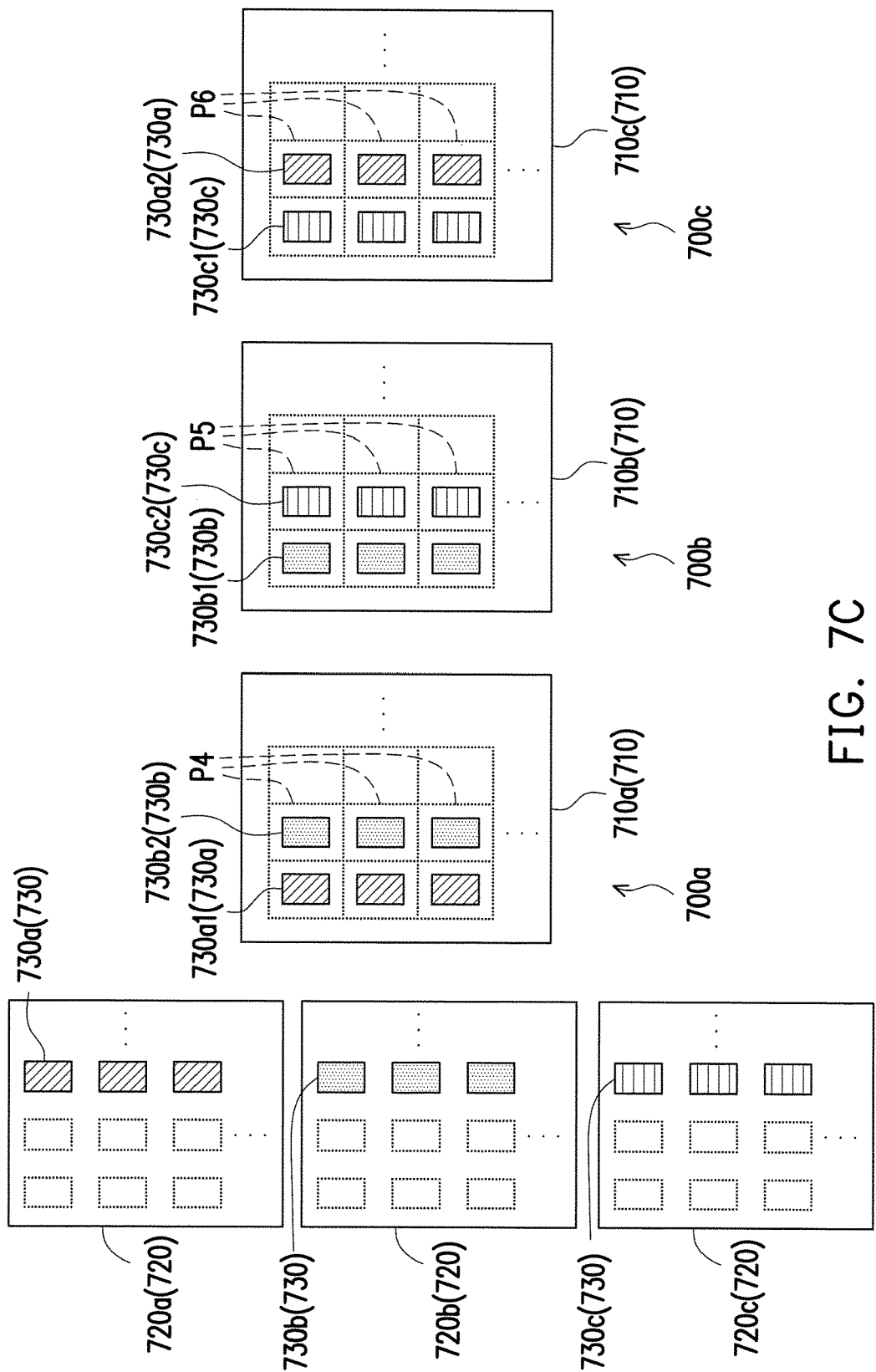

Referring to FIG. 7C, the fourth bonding layers (not shown), the fifth bonding layers (not shown), and the sixth bonding layers (not shown) are respectively formed at the fourth positions P4 of the first back plate 710a, the fifth positions P5 of the second back plate 710b, and the sixth positions P6 of the third back plate 710c. Then, the second transfer platform 720b is docked to the first back plate 710a, the third transfer platform 720c is docked to the second back plate 710b, and the first transfer platform 720a is docked to the third back plate 710c, so as to bond a plurality of second light emitting devices 730b2 (a part of the second light emitting devices 730b) to the fourth positions P4 of the first back plate 710a through the fourth bonding layers, bond a plurality of third light emitting devices 730c2 (a part of the third light emitting devices 730c) to the fifth positions P5 of the second back plate 710b through the fifth bonding layers, and bond a plurality of first light emitting devices 730a2 (a part of the first light emitting devices 730a) to the sixth positions P6 of the third back plate 710c through the six bonding layers. Specifically, when the respective transfer platforms 720 are docked to the back plates 710, such as the first back plate 710a, the second back plate 710b, and a third back plate 710c, positions of the light emitting devices 730 on the transfer platforms 720 not bonded to the back plates 710 do not correspond to positions of the light emitting devices 730 already bonded to the back plates 710.

Figure 7D:
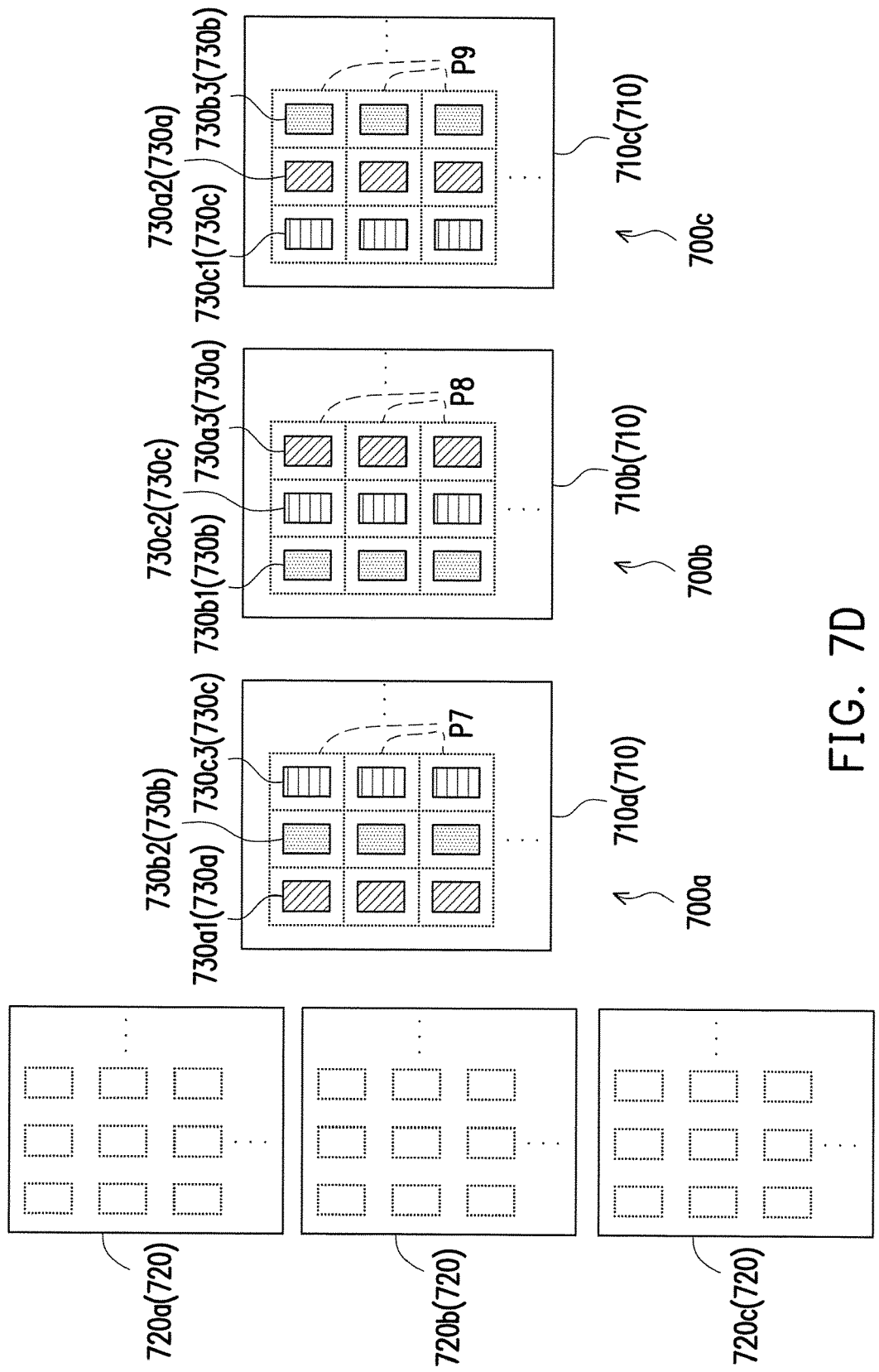

Referring to FIG. 7D, in the third embodiment, the process step is similar to the repetitive Step S20 of FIG. 1. The light emitting devices 730 with different emission colors on the respective transfer platforms 720 are transferred to the back plates 710 to manufacture the full-color display 700a, the display 700b, and the display 700c. Specifically, a plurality of third light emitting devices 730c3 (a part of the third light emitting devices 730c) are bonded to the seventh positions P7 of the first back plate 710a, a plurality of first light emitting devices 730a3 (a part of the first light emitting devices 730a) are bonded to the eighth positions P8 of the second back plate 710b, and a plurality of second light emitting devices 730b3 (a part of the second light emitting devices 730b) are bonded to the ninth positions P9 of the third back plate 710c. Similar to the first and second embodiments, the light emitting devices 730 of the transfer platform 720 can be selected by the bonding layers 140 and be bonded to the back plate 710 in several times, and in each time of the docking step, a predetermined number of light emitting devices 730 are bonded to the back plate 710. Therefore, according to the manufacturing method of the display (e.g., the display 700a, the display 700b, and the display 700c), the light emitting devices 730 of different colors are able to be quickly and accurately arranged on the back plate 710a of the display 700a, the back plate 710b of the display 700b, and the back plate 710c of the display 700c. Accordingly, with the number of the light emitting devices disposed on the transfer platforms being effectively used, the number of times of alignment is further reduced, thereby facilitating the manufacturing efficiency, reducing the manufacturing cost, and increasing the quality of the display.

Based on above, in the manufacturing method of the display according to the embodiments of the invention, the bonding layers are not formed on the back plate in one time, but are formed on the predetermined positions which are about to be bonded in several times. Accordingly, it can achieve the effect that a predetermined number of the light emitting devices at predetermined positions on the transfer platform are transferred to the back plate by the arrangement of the bonding layer.

In view of the foregoing, in the manufacturing method of the display according to the embodiments of the invention, the transfer platforms and the back plate are docked to bond the respective parts of the light emitting devices in several times. In addition, when the transfer platform is docked to the back plate, the positions of the light emitting devices on the transfer platform correspond to the positions without the light emitting devices on the back plate. Therefore, the light emitting devices on the transfer platforms which are about to bond to the back plate do not contact the light emitting devices already bonded to the back plate. The probability of collision during the docking step can be greatly reduced. In addition, since the light emitting devices with different emission colors on the display are transferred to the back plate by docking the transfer platforms to the back plate in several times, and in each time of the docking step, a predetermined number of light emitting devices are bonded to the back plate. Therefore, the manufacturing method of the display according to the embodiments of the invention is able to quickly and accurately arrange the light emitting devices with different emission colors on the back plate of the display, making the manufacturing cost of the display lower and the yield rate of the display higher.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A manufacturing method of a display, comprising:
providing a back plate;
providing a first transfer platform, wherein a plurality of first light emitting devices are disposed on the first transfer platform;
forming a plurality of first bonding layers at a plurality of first positions of the back plate;
docking the first transfer platform to the back plate after forming the plurality of first bonding layers to transfer the plurality of first light emitting devices to the plurality of first positions by the plurality of first bonding layers, wherein the number of the plurality of first light emitting devices bonded to the back plate is equal to the number of the plurality of first bonding layers;
providing a second transfer platform, wherein a plurality of second light emitting devices are disposed on the second transfer platform;
forming a plurality of second bonding layers at a plurality of second positions of the back plate;
docking the second transfer platform to the back plate after forming the plurality of second bonding layers to transfer the plurality of second light emitting devices to the plurality of second positions by the plurality of second bonding layers, wherein the number of the plurality of second light emitting devices bonded to the back plate is equal to the number of the plurality of second bonding layers, wherein the first transfer platform is at a first docking position of the back plate in the step of docking the first transfer platform to the back plate, the second transfer platform is at a second docking position of the back plate in the step of docking the second transfer platform to the back plate, and there is a shifting distance between the first docking position and the second docking position;
providing a third transfer platform, wherein a plurality of third light emitting devices are disposed on the third transfer platform;
forming a plurality of third bonding layers at a plurality of third positions of the back plate;
docking the third transfer platform to the back plate, such that the plurality of third light emitting devices corresponding to the plurality of third positions are bonded to the plurality of third positions by the plurality of third bonding layers;
forming a plurality of fourth bonding layers at a plurality of fourth positions of the back plate;
docking the third transfer platform to the back plate, such that the plurality of third light emitting devices corresponding to the plurality of fourth positions are bonded to the plurality of fourth positions by the plurality of fourth bonding layers;
forming a plurality of fifth bonding layers at a plurality of fifth positions of the back plate;
docking the first transfer platform to the back plate, such that the plurality of first light emitting devices corresponding to the plurality of fifth positions are bonded to the plurality of fifth positions by the plurality of fifth bonding layers;
forming a plurality of sixth bonding layers at a plurality of sixth positions of the back plate;
docking the second transfer platform to the back plate, such that the plurality of second light emitting devices corresponding to the plurality of sixth positions are bonded to the plurality of sixth positions by the plurality of sixth bonding layers;
forming a plurality of seventh bonding layers at a plurality of seventh positions of the back plate;
docking the second transfer platform to the back plate, such that the plurality of second light emitting devices corresponding to the plurality of seventh positions are bonded to the plurality of seventh positions by the plurality of seventh bonding layers;
forming a plurality of eighth bonding layers at a plurality of eighth positions of the back plate;
docking the third transfer platform to the back plate, such that the plurality of third light emitting devices corresponding to the plurality of eighth positions are bonded to the plurality of eighth positions by the plurality of eighth bonding layers;
forming a plurality of ninth bonding layers at a plurality of ninth positions of the back plate; and
docking the first transfer platform to the back plate, such that the plurality of first light emitting devices corresponding to the plurality of ninth positions are bonded to the plurality of ninth positions by the plurality of ninth bonding layers.

2. The manufacturing method of the display as claimed in claim 1, wherein when the second transfer platform is docked to the back plate, projections of the plurality of second light emitting devices disposed on the second transfer platform on the back plate do not overlap with the plurality of first positions, and the plurality of first positions and the plurality of second positions correspond to a plurality of sub-pixel regions of the display.

3. The manufacturing method of the display as claimed in claim 1, wherein when the third transfer platform is docked to the back plate, projections of the plurality of third light emitting devices of the third transfer platform on the back plate do not overlap with positions of the plurality of first light emitting devices and the plurality of second light emitting devices on the back plate.

4. The manufacturing method of the display as claimed in claim 1, wherein the plurality of first light emitting devices, the plurality of second light emitting devices, and the plurality of third light emitting devices respectively emit light in different emission colors, and are arranged into strip arrangement on the back plate.

5. The manufacturing method of the display as claimed in claim 1, wherein the plurality of first light emitting devices, the plurality of second light emitting devices, and the plurality of third light emitting devices emit light in respectively different emission colors, and are arranged into mosaic arrangement on the back plate.

6. The manufacturing method of the display as claimed in claim 1, wherein the plurality of first positions, the plurality of second positions, and the plurality of third positions are in matrix arrangement and located in a region of the back plate.

7. The manufacturing method of the display as claimed in claim 1, wherein one of the plurality of first light emitting devices, one of the plurality of second light emitting devices, and one of the plurality of third light emitting devices adjacent on the back plate form a display pixel of the display.

8. The manufacturing method of the display as claimed in claim 1, wherein the step of providing the first transfer platform further comprises:

forming an adhesion layer between the plurality of first light emitting devices and the first transfer platform, such that the plurality of first light emitting devices are fixed on the first transfer platform through an adhesion force provided by the adhesion layer.

9. The manufacturing method of the display as claimed in claim 8, wherein when the first transfer platform and the back plate are docked, the plurality of first bonding layers provides a bonding force to the plurality of first light emitting devices, and the bonding force is greater than the adhesion force.

10. The manufacturing method of the display as claimed in claim 8, further comprising:

after docking the first transfer platform to the back plate in order to bond the plurality of first light emitting devices to the back plate by the plurality of first bonding layers, separating the first transfer platform and the back plate, wherein a residual material of the adhesion layer remains on at least a part of the plurality of first light emitting devices.

11. The manufacturing method of the display as claimed in claim 10, further comprising removing the residual material of the adhesion layer on the plurality of first light emitting devices.

12. The manufacturing method of the display as claimed in claim 1, wherein a diagonal length of each of the plurality of first light emitting devices and the plurality of second light emitting devices is in a range from 2 micrometers to 150 micrometers.

\* \* \* \* \*